US012597905B2

(12) United States Patent　　　　(10) Patent No.:　US 12,597,905 B2
Tu et al.　　　　　　　　　　　　　(45) Date of Patent:　　　Apr. 7, 2026

(54) IMPEDANCE MATCHING NETWORK

(71) Applicant: EM Microelectronic-Marin SA, Marin (CH)

(72) Inventors: Cao-Thong Tu, Lausanne (CH); Kevin Scott Buescher, Colorado Springs, CO (US)

(73) Assignee: EM Microelectronic-Marin SA, Marin (CH)

( * ) Notice: Subject to any disclaimer, the term of this patent is extended or adjusted under 35 U.S.C. 154(b) by 119 days.

(21) Appl. No.: 18/618,222

(22) Filed: Mar. 27, 2024

(65) Prior Publication Data

US 2024/0348226 A1　　Oct. 17, 2024

(30) Foreign Application Priority Data

Apr. 14, 2023　(EP) ..................................... 23168089

(51) Int. Cl.
　　*H03H 7/40*　　　(2006.01)
　　*G06K 19/07*　　(2006.01)
　　*H03H 7/38*　　　(2006.01)
(52) U.S. Cl.
　　CPC ........... *H03H 7/40* (2013.01); *G06K 19/0723* (2013.01); *H03H 7/383* (2013.01)
(58) Field of Classification Search
　　CPC .......... H03H 7/38; H03H 7/40; H03H 7/0115; H03H 11/30; H03H 2007/386; H03H 7/09; H03H 7/01; H03H 7/17; H03H 7/383; H03H 11/04; H03H 7/42; H03F 1/565; H03F 2200/387; H03F 2200/451; H03F 2200/297; H03F 2200/301; H03F 2200/306; H03F 2200/309; H03F 2200/391; H03F 2200/399; H03F 1/0288; H03F 2200/222; H03F 3/189; H03F 3/193; H03F 3/24; H03F 3/195; H03F 3/245; H04B 1/0458; H04B 1/18
See application file for complete search history.

(56) References Cited

U.S. PATENT DOCUMENTS

| | | | | |
|---|---|---|---|---|
| 9,087,282 B1 * | 7/2015 | Hyde | ................. | G06K 19/0726 |
| 10,141,971 B1 * | 11/2018 | Elkholy | .............. | H04B 7/2615 |
| 2016/0211824 A1 | 7/2016 | Kando et al. | | |
| 2020/0059208 A1 | 2/2020 | Yang et al. | | |
| 2023/0049925 A1 * | 2/2023 | Lo | ....................... | H03F 3/45475 |

OTHER PUBLICATIONS

Search Report issued Sep. 29, 2023 in European Application No. 23168089.

* cited by examiner

*Primary Examiner* — Lincoln D Donovan
*Assistant Examiner* — Tyler J Pereny
(74) *Attorney, Agent, or Firm* — Sughrue Mion, PLLC

(57)　　　　　　　ABSTRACT

An impedance matching network (10) for an active RFID transceiver (1), the impedance matching network (10) including: an impedance transformer (14) including a transformer input (13) and a transformer output (15), wherein the transformer input (13) is connectable to an antenna (12), an RF modulator (16) connectable to the transformer output (15), and an RF demodulator (20) capacitively coupled to the transformer output (15) via a capacitor (18).

13 Claims, 2 Drawing Sheets

Figures 3, 4, 5:
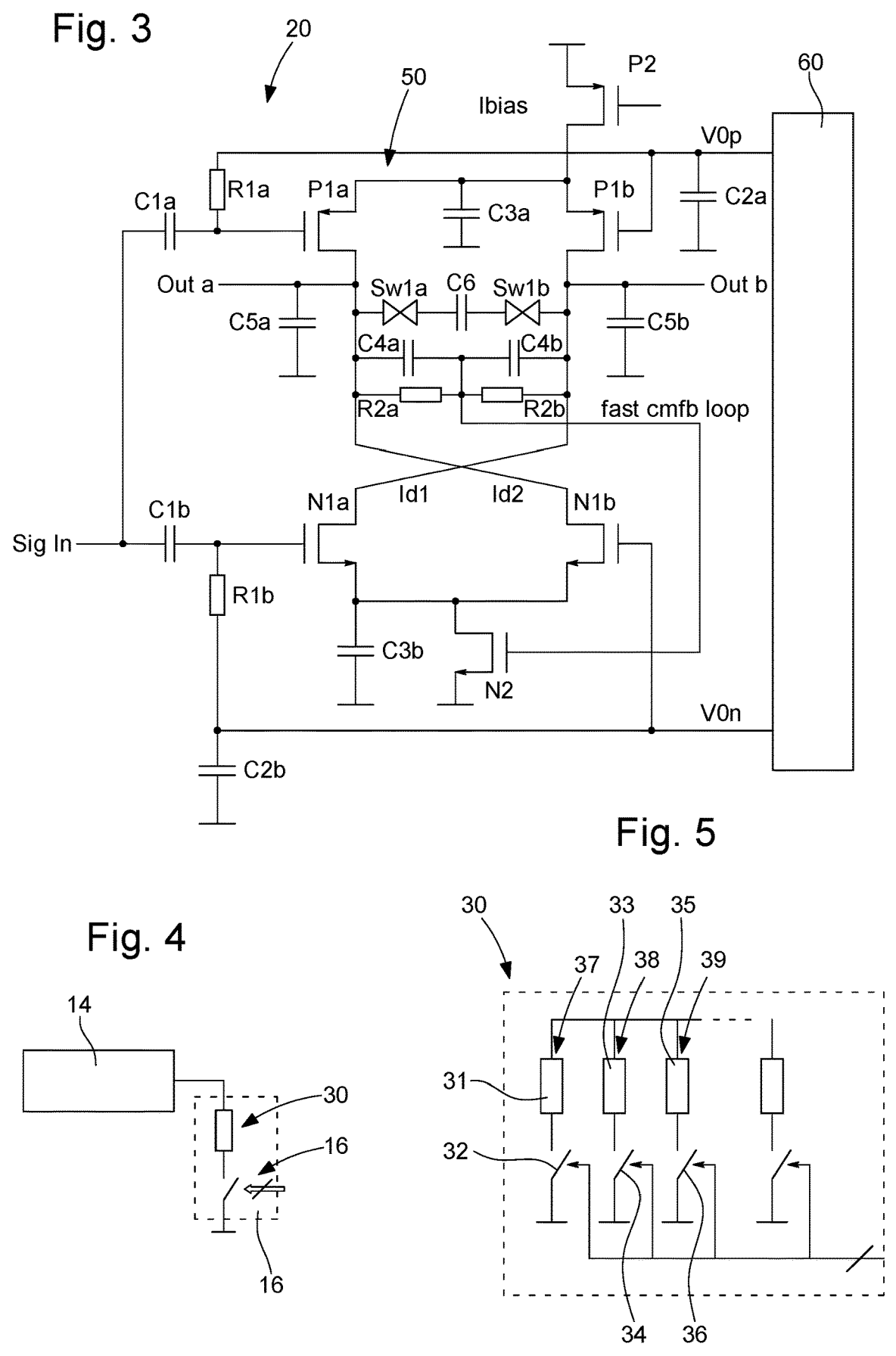

Ibias   P2

V0p

C1a   R1a   P1a   C3a   P1b   C2a   60

Out a   Sw1a   C6   Sw1b   Out b

C5a   C4a   C4b   C5b

R2a   R2b   fast cmfb loop

N1a   Id1   Id2   N1b

Sig In   C1b

IMPEDANCE MATCHING NETWORK

CROSS-REFERENCE TO RELATED APPLICATIONS

This application claims priority based on European Patent Application No. 23168089.3 filed Apr. 14, 2023, the entire disclosures of which are incorporated by reference herein.

FIELD OF THE INVENTION

The present invention relates to the field of impedance matching for wireless transceivers, such as active RFID transceivers.

BACKGROUND

In the field of RFID transceivers or RFID device in general, e.g. operating in the range of 5.8 GHz it is commonly known to use a diode as a demodulator and an RF-switch as a modulator for demodulating downlink signals and/or for modulating uplink signals. While this technique is rather straightforward it has some drawbacks in terms of sensitivity and transmission range.

For instance and with implementations of Ultra High Frequency (UHF) battery-powered RFID devices, particularly at 5.80 GHz, there is typically used an external diode to demodulate downlink signals and hence downlink data received via an antenna and to modulate respective uplink signals or uplink data, e.g. received from a processor of the RFID device, with an RF switch.

Such diodes may be implemented external to an integrated circuit whereas the RF switch may be integrated into the integrated circuit of the RFID transceiver. Such solutions have some drawbacks in terms of sensitivity during the receive phase, i.e. when receiving and demodulating downlink data.

Additionally, such solutions may be less efficient and comparatively difficult to bias, e.g. during a backscatter transmission phase.

It is therefore an object of the present invention to provide an improved RFID transceiver that exhibits an increased degree of sensitivity with respect to downlink data and which is implementable in a rather cost efficient as well as space saving way.

SUMMARY OF THE INVENTION

In one aspect there is provided an impedance matching network for an active RFID device, e.g. for an RFID transceiver. The impedance matching network comprises an impedance transformer. The impedance transformer comprises a transformer input and a transformer output. The transformer input is connectable to an antenna, to which the active RFID device may be coupled.

The impedance matching network further comprises an RF modulator connectable to the transformer output and an RF demodulator capacitively coupled to the transformer output via a capacitor. The RF modulator is typically connected to the transformer output.

The impedance transformer provides a comparatively high impedance transformation ratio between the transformer input and at least one of a signal processor and the RF demodulator connectable and/or connected to an output of the RF demodulator. This way, there is provided a large increase in the signal voltage at the expense of a lower current for the demodulator. The higher voltage may be immediately demodulated and the downlink sensitivity of the impedance matching network and hence of the RFID transceiver may be increased by a gain in voltage due to the impedance transformation.

Additionally, the RF uplink or RF transmission path that extends from the signal processor and/or from the demodulator towards the antenna goes through the same network in the opposite direction. Due to the reciprocity, the modulation output impedance can be decreased by the same ratio as the impedance has been increased in the downlink direction.

In other words, the impedance transformer serves to increase the input impedance and serves to decrease the output impedance by the same ratio.

Typically, the impedance transformer is implemented as a passive transformer. It does not consume any electric power or energy. By increasing the input or downlink impedance at the expense of a decrease of the output impedance, it is possible to make use of much smaller components for implementing the impedance matching network. In effect, smaller value resistors and switching devices can be used, e.g. in order to control a backscatter modulation and/or transmission of the respective uplink signals or data.

This results in lower parasitic effects. In addition, and when making use of comparatively small value resistors and/or switching devices the footprint of the respective hardware components can be decreased, thus allowing to implement the impedance matching network in a rather compact way.

In addition, use of smaller value resistors and switching devices may increase the power efficacy of the impedance matching network and hence of the entire RFID device.

According to a further example, the impedance transformer comprises a first branch provided with a first inductor. The first branch is connected to the transformer input with one end. It is further connected to the RF modulator with another end. The first inductor may be provided external to the integrated circuit of the impedance matching network.

With a further example, the impedance matching the work comprises a second branch provided with a second inductor. The second branch is connected to the RF modulator with one end and is further connected to ground with a second end. The second branch may branch off from the first branch and may be connected with another end to ground. This way, the first and the second branch may form a L-type matching network comprising a first inductor and a second inductor.

With a further example of the impedance matching network an inductivity of the first conductor is larger than an inductivity of the second inductor. With some examples, it is the second end of the first inductor, that is connected to the first end of the second inductor. The first end of the first inductor is connected or connectable to the antenna whereas the second end of the first inductor is connectable or is connected to at least one of the RF modulator and the RF demodulator.

With the inductivity of the first inductor being larger than an inductivity of the second inductor there can be provided an effective impedance increase or impedance gain in the downlink direction and an impedance decrease or impedance depletion in the uplink direction.

With a further example the first end of the second branch is connected to the first inductor, typically to the second end of the first inductor facing away the antenna. In this way, the first and the second branch form a L-network, which is effective to provide the impedance increase in the downlink direction and a respective impedance decrease in the uplink direction.

With a further example, the impedance matching network comprises a third branch provided with a capacitor, e.g. implemented as a tunable capacitor. The third branch is connected to the RF modulator with one end and is connected to ground with a second end. With some examples, the third branch is arranged parallel to the second branch. Hence, the first end of the capacitor may be connected to the first end of the second inductor. The second end of the capacitor and of the second inductor may be connected to ground.

The combination of the first inductor, the second conductor together with the e.g. tunable capacitor provides a tunable impedance matching network, wherein the increase in impedance in the downlink direction as well as a decrease in impedance in the uplink direction can be selectively tuned.

According to a further example, the first end of the third branch is connected to the first inductor. Likewise, the first end of the third branch may be connected to the first end of the second branch. This way, the second and the third branch may be connected in parallel and may both terminate with their first end in the first branch. The first branch may extend from the transformer input to the transformer output. The transformer input may be connected or may be connectable to the antenna and the transformer output may be connected to the RF modulator, typically to an input of the RF modulator.

With a further example the RF modulator is connected to an input of the RF demodulator. Between the RF modulator, the third branch of the impedance transformer and the RF demodulator there may be provided a capacitor. This way, the input of the RF demodulator can be capacitively coupled to the RF modulator.

According to a further example, the RF modulator comprises a tunable resistor. Since the RF modulator is provided on a downlink side of the impedance transformer a current present to the tunable resistor may be comparatively low. This allows to make use of comparatively small sized or small dimensioned resistors, which enables to reduce the footprint of the impedance matching network and hence of the active RFID device.

With a further example the tunable resistor comprises a first resistor branch and at least a second resistor branch. The first and the second resistor branches are parallel to each other. At least one of the first resistor branch and the second resistor branch comprises a resistor in line with a switch. With some examples the resistor comprises a polysilicon or is made of a polysilicon material. The switch may be implemented as an NMOS device, e.g. in form of a NMOS transistor, providing a comparatively fast switching behavior.

With some examples, the first resistor branch comprises a first resistor in line with a first switch and the second resistor branch comprises a second resistor in line with a second switch. By closing or opening respective first and second switches, the overall electric resistivity of the tunable resistor can be modified accordingly. With some examples, the resistivity of first and second resistors is substantially identical. With other examples, the resistivity of the first and the second resistors differs. With some examples, the tunable resistor comprises a first branch, a second branch and further branches in order to provide a comparatively large range of different resistances. With some examples, the tunable resistor comprises at least four branches, each of which provided with a resistor and a switch. With further examples, the tunable resistor comprises at least 5 branches, at least 6 branches, at least 7 branches or at least 8 branches, each of which comprising a resistor and a switch.

With further examples, the resistivity of different branches may differ with their resistivity by a factor of 2. The second branch may comprise a resistivity twice as large as the resistivity of the resistor of the first branch. The resistivity of the resistor of the third branch may be twice as large as resistivity of the resistor of the second branch. The resistor of the fourth branch may comprise a resistivity being twice as large as the resistivity of the preceding branch, i.e. of the third branch, and so on. In this way, there can be provided a large range of switchable resistances, which can be controlled by opening and closing of the respective switches of the individual branches.

According to a further example, the RF demodulator comprises an amplifier, e.g. implemented as a push-pull amplifier. The amplifier comprises a first PMOS transistor and a second PMOS transistor. The amplifier further comprises a first NMOS transistor and a second NMOS transistor. Here, the gates of the first and the second NMOS transistors are connected to the impedance transformer output via the capacitor. This provides a voltage enhanced input signal at the demodulator. A voltage gain is obtained by the passive gain derived from the impedance transformer.

Furthermore, the RF demodulator comprises a common mode feedback loop connected with one end to the drain of the first PMOS transistor and to the drain of the second PMOS transistor. The common mode feedback loop is connected with another end to the source of the first NMOS transistor and to the source of the second NMOS transistor. The common mode feedback loop provides a rather stable and well-defined operation of the amplifier of the demodulator. Moreover, the common mode feedback loop provides for a comparatively fast start-up of the demodulator, which can thus react rather instantaneously when receiving RF signals in the downlink direction, hence from the impedance transformer.

According to another aspect, the present invention further relates to an active RFID transceiver. The RFID transceiver comprises an antenna and an impedance matching network as described above and connected to the antenna. The active RFID transceiver or RFID transmitter further comprises a signal processor connected to an output of the demodulator of the impedance matching network. Since the RFID transceiver comprises an impedance matching network as described above, all features, effects and benefits as described above in connection with the impedance matching network equally apply to the RFID transceiver; and vice versa.

The impedance matching network provides a passive RF voltage gain matching network with a high impedance input RF detector. The RF input signal as e.g. provided by the impedance transformer is capacitively coupled into the gates of the NMOS transistors of the amplifier of the RF demodulator. In this way, there is provided a comparatively large impedance. The gates of the NMOS transistors therefore become rather independent of the input power. This way, the impedance matching network provides a comparatively large impedance transformation from a low impedance antenna to a comparatively high impedance RF demodulator resulting in a large voltage gain prior to a demodulation to baseband.

This passive gain is of particular advantage over using a simple diode to demodulate the RF signal. The extra gain as provided by the impedance transformer improves the noise figure (NF) of the receiver or demodulator while requiring fewer amplification stages after the demodulation as well.

This way, also a reading distance or transmission range can be increased. The impedance matching network is particularly dedicated for an active RFID device, such as an active RFID transceiver. Hence, there is no requirement to provide an energy harvesting rectifier that may otherwise have a variable input impedance, which would have to be matched to optimum energy transfer at the low end of the dynamic range.

Furthermore, the comparatively large impedance transformation of the matching network allows the use of a low parasitic backscatter modulator. Due to the impedance transformation, the use of high impedance switching networks is acceptable because the impedance seen at the antenna is much lower than the impedance of the actual switches. This allows using of comparatively small or small sized hardware components, such as resistors or switches that have low parasitic effects. Additionally, the impedance of the RF modulator can be adjusted, e.g. with multiple switching devices as described above whose timing or switching behaviour can be independent from each other to allow for wave shaping of a modulation pattern. The switch setting allows for an optimization of the spectral content of this backscattered signal helping to meet governmental regulatory requirements.

With some examples, the impedance transformer is operable to provide an increase in the signal voltage in the downlink direction, hence from the antenna towards the demodulator of up to 5 dB, up to 7 dB, up to 10 dB or even more than 10 dB. In the same way, the current is decreased by the same amplification or attenuation. Hence, the current in the downlink direction can be reduced by up to 5 dB, up to 7 dB, up to 10 dB or even more than 10 dB.

With some examples, the active RFID transceiver is configured to operate in the Ultrahigh Frequency Range (UHF). It may operate in the 5.8 GHz band.

The impedance matching network and the active RFID transceiver as described herein provide the benefit of a passive RF voltage gain compared to a conventional diode implementation. For the receiver there can be provided a rather large improvement in Noise Figure (NF), e.g. 10 dB or even more.

The present design provides a high degree of flexibility in impedance transformation. The center frequency can be easily tuned. The modulator implementation is rather straightforward, easy and cost efficient. Due to small modulator devices, there are provided only fairly low parasitic effects. The backscattered strength, hence the S11 value, can be easily programmed. The present design is further beneficial in that it provides an easy method to provide wave-shaping of a backscattered signal. Over the entire dynamic range the present design provides a near constant input impedance. For the modulation there is no bias voltage required. There can be optionally provided a rather robust ESD protection.

BRIEF DESCRIPTION OF THE DRAWINGS

In the following numerous examples of the invention will be described in greater detail by making reference to the drawings, in which:

FIG. 3 shows an example of an RF demodulator in greater detail, FIG. 4 shows a block diagram of an example of an RF modulator and FIG. 5 shows a detailed illustration of an example of a tunable resistor of the RF modulator according to FIG. 4.

DETAILED DESCRIPTION OF THE INVENTION

Figure 1:
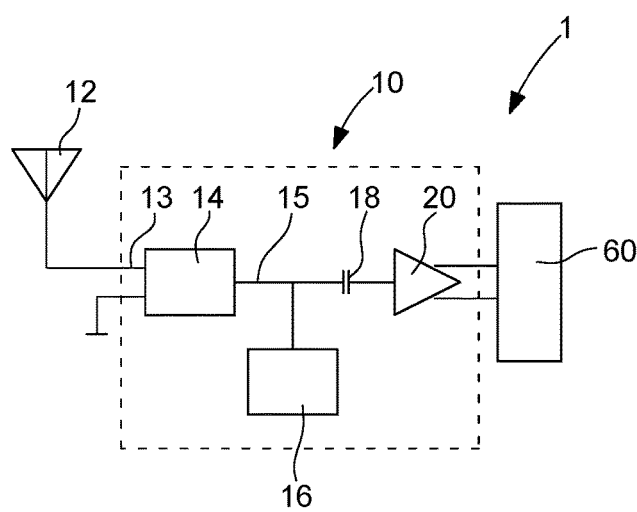
FIG. 1 shows a simplified block diagram of the impedance matching network.
Figure 2:
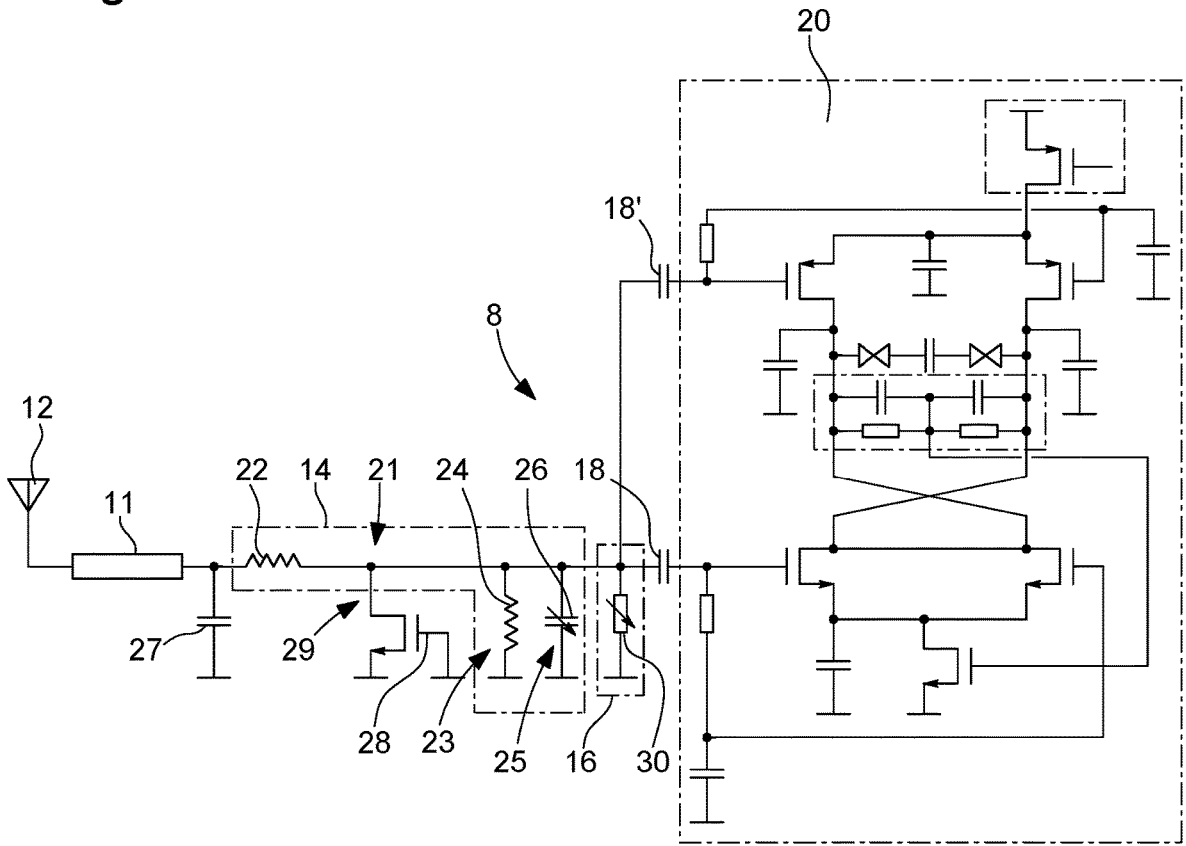
FIG. 2 shows a further block diagram of the impedance matching network in greater detail.

In FIGS. 1 through 5 there is schematically illustrated an example of an RFID transceiver 1. The RFID transceiver 1 comprises an antenna 12 connected to a signal processor 60 via an impedance matching network 10. The impedance matching network 10 is shown in greater detail in FIGS. 2-5. The impedance matching network 10 comprises an impedance transformer 14 and an RF modulator 16, which are coupled by a capacitor 18 to a demodulator 20. An output of the demodulator 20 and hence an output of the impedance matching network 10 is connected to a signal processor 60. The details of the impedance transformer 10 are particularly described in connection with FIG. 2.

The impedance transformer 10 comprises a transformer input 13, which is connected or which is connectable via a transmission line 11 to the antenna 12. The impedance transformer 14 further comprises a transformer output 15, which is connected to the RF modulator 16 and which is further connected to the capacitor 18, which in turn is further connected to an input of the RF demodulator 20.

The impedance transformer 14 comprises a first inductor 22 and a second inductor 24 as well as a tunable capacitor 26. The second inductor 24 and the tunable capacitor 26 are arranged in parallel. A first end or a first terminal of the second inductor 24 as well as a first end or first terminal of the capacitor 26 may be connected to a first branch 21 of the impedance transformer 14, which first branch 21 extends from the transformer input 13 to the transformer output 15. A second and hence opposite end or second terminal of the second inductor 24 as well as a second end of the tunable capacitor 26 is connected to ground. The first branch 21 is provided with a first inductor 22. A first end of the first inductor 22 is connected to the transformer input 13. An opposite and hence a second end or terminal of the first inductor 22 is connected to the transformer output 15. Hence, the second end of the first inductor 22 may be connected with the second inductor 24 and with the tunable capacitor 26.

The second inductor 24 may be provided in or on a second branch 23 extending from the first branch 21 to ground. The tunable capacitor 26 may be provided on or in a third branch 25 extending between the first branch 21 and ground. There may be provided a fourth branch 29 provided with or comprising a voltage limiter 28. The fourth branch 29 is connected to ground with one end and is further connected to the first branch 21. It may merge into the first branch 21 downstream of the first inductor 22.

The transformer input 13 may be further provided or connected with a parasitic capacitor 27, which is connected to ground with an opposite end.

The RF modulator 16 comprises a tunable resistor 30. The RF modulator 16 may be connected to the transformer output 15 with one end and may be further connected with an input of the RF demodulator 20. Details of the RF modulator 16 are shown in FIGS. 4 and 5. The RF modulator 16 comprises a tunable resistor 30. As shown in FIG. 5 the tunable resistor 30 may comprise a first resistor branch 37, a second resistor branch 38 and a third resistor branch 39 as well as further resistor branches. The resistor branches 37, 38, 39 are all connected in parallel. Each resistor branch 37, 38, 39 comprises a resistor 31, 33, 35 and a switch 32, 34, 36. In detail, the first resistor branch 37 comprises the first resistor 31 in line with the first switch 32. The second resistor branch 38 connected parallel to the first resistor branch 37 comprises a second resistor 33 in line with a second switch 34. The third resistor branch 39 parallel with the first resistor branch 37 and parallel with the second resistor branch 38 comprises the third resistor 35 in line with a third switch 36.

The individual resistors 31, 33, 35 may distinguish with regard to their resistivity. With some examples, the resistivity of the second resistor 33 is twice as large as the resistivity of the first resistor 31. The resistivity of the third resistor 35 may be twice as large as a resistivity of the second resistor 33. In this way, there can be provided a binary switchable tunable resistor 30 allowing to vary the overall resistivity of the tunable resistor 30 over a comparatively large range. With some examples the resistor 31, 33, 35 comprises polysilicon or the resistor material is made of polysilicon. The switches 32, 34, 36 may be implemented as NMOS devices, in particular as NMOS transistors. The variable configuration of the tunable resistor 30 allows to control the strength of a backscattered signal or to provide a waveshaping of the uplink signals or data.

The demodulator 20 comprises a push pull amplifier 50. The push pull amplifier 50 comprises a first NMOS transistor P1a and a second NMOS transistor P1b. The push pull amplifier 50 further comprises a first NMOS transistor N1a and a second NMOS transistor N1b. The sources of the PMOS transistors P1a, P1b are mutually connected. Also, the sources of the NMOS transistors N1a, N1b are mutually connected. The sources of the PMOS transistors P1a, P1b are further connected with a drain of a third PMOS transistor P2. A gate of the third PMOS transistor P2 is connected to a bias current source Ibias and the source of the third PMOS transistor P2 is connected to ground. The sources of the NMOS transistors N1a, N1b are connected with the drain of a third NMOS transistor N2. The source of the third NMOS transistor N2 is connected to ground.

The drains of the first and second PMOS transistors P1a, P1b are further connected by three parallel branches. A first branch comprises a first transient voltage suppression diode Sw1a in line with a capacitor C6 and further in line with a second transient voltage suppression diode Sw1b. The second branch comprises a capacitor C4a in line with a capacitor C4b and with a second node between these capacitors C4a, C4b. The third branch comprises a resistor R2a in line with a resistor R2b with a third node between the resistors R1a, R2b. The second and the third nodes are interconnected and form part of a fast common mode feedback loop 40. Here, the second and third nodes are connected to the gate of the third NMOS transistor N2. the sources of the PMOS transistors P1a, P1b are connected to ground by a capacitor C3a.

The RFID modulator 20 comprises a first output Out a connected to the drain of the first PMOS transistor P1a. The first output Out a is further connected to ground via a capacitor C5a. The RFID modulator 20 further comprises a second output Out b connected to the drain of the second PMOS transistor P1b. The second output Out b is further connected to ground via a capacitor C5b.

The gates of the first and second PMOS transistors P1a, P1b are mutually connected via a resistor R1a. The gate of the first PMOS transistor P1a is connected to the input capacitor C1a, which in turn is further connected to the signal input Sig In, which is connected to the transformer output 15.

Likewise, the gates of the first and second NMOS transistors N1a, N1b are mutually connected via a resistor R1b. The gate of the first NMOS transistor N1a is connected to another capacitor C1b, which in turn is further connected to the signal input Sig In. The capacitors C1b, C1a are connected parallel.

The gate of the second PMOS transistor P1b is connected to a first signal input terminal V0p and the gate of the second NMOS transistor N1b is connected to a second signal input terminal Von. The first signal input terminal V0p is connected to ground via a capacitor C2a. The second signal input terminal V0n is connected to ground via a capacitor C2b. A node connected to the gate of the second NMOS transistor N1b is located between the resistor R1b and the capacitor C2b. A node connected to the gate of the second PMOS transistor P1b is located between the resistor R1a and the capacitor C2a.

The source of the first NMOS transistor Nia is connected to ground via a capacitor C3b. A node between the source of the first NMOS transistor N1a and the capacitor C3b is connected to the drain of the third NMOS transistor N2.

The drain of the second PMOS transistor P1b is connected to the drain of the first NMOS transistor N1a and the drain of the first PMOS transistor P1a is connected to the drain of the second NMOS transistor N1b.

In effect, the RF demodulator 20 is connected to the impedance transformer 10 to obtain maximum benefit of the resulting voltage gain. The architecture of the RF demodulator 20 is connected to the antenna 12 in conjunction with the impedance transformer 10 and the fact that it is a high input impedance structure compliments the impedance transformer 10 to allow for a unique low power, high sensitivity RFID stage. The RF demodulator 20, is actually a combination of an low noise amplifier (LNA) and baseband convertor and simultaneously provides gain and demodulation. It is easily possible to have a –45 dBm sensitivity out of the arrangement of the impedance transformer 10 or matching network and the LNA or RD demodulator 20.

The RF demodulator 20 comprises the push/pull amplifier 50 using the two PMOS devices (P1a and P2a) and the NMOS devices (N1a and N2a) to reuse current and provide maximum gain with minimum current. The voltage enhanced input signal (the voltage gain is the passive gain derived from the impedance transformer) is simultaneously applied to P1a and N1a on one side of the differential structure while a DC reference level is applied to both sides of the differential structure to bias the devices. R1a, R1b and C1a, C1b provide the bias to P1a, P1b and N1a, N1b while AC coupling the input RF signal (through a high pass filter) into the LNA structure. The resistors R1a, R1b also set the input impedance of the amplifier 50 and hence of the RF demodulator 20 which allows to control the bandwidth and gain of the impedance transformer 10.

The capacitors C2a, C2b are used to filter the V0p and Von input voltages that bias the PMOS transistors P1a, P1b and the NMOS transistors N1a, N1b. The capacitors C3a, C3b are used to demodulate the signal by keeping the tail voltage fixed. The resistors R2a, R2b and the capacitors C4a, C4b are used to control the common mode feedback that keeps the average (DC) voltage of the output signals at Out a and Out b at a desired level.

Additionally, the capacitors C4a, C4b, C5a, C5b set the bandwidth of the differential output signal at the outputs Out a, Out b. This is set to remove any ripple from the output that is present at the RF frequency and above while not filtering the baseband (demodulated) output signal, thus the bandwidth must be between the RF input frequency (5.8 Ghz) and the maximum baseband frequency (1-2 Mhz).

The components Sw1a, Sw1b and C6 are used to change the filtering frequency to optimize the amplifier 50 or RD demodulator 20 for the input data rate. The third PMOS transistor P2 is used to set the bias current of the amplifier 50 and the RD demodulator 20 while the third NMOS transistor N2 is used to sink this same current through the common mode feedback loop 40.

The output of the structure is Out a, Out b and provides the demodulated RF signal which can then be sampled by a comparator to generate a digital data stream that represents the modulated signal from the RF reader.

NOMENCLATURE 8 integrated circuit
10 impedance matching network
11 transmission line
12 antenna
13 transformer input
14 impedance transformer
15 transformer output
16 modulator
18 capacitor
demodulator
21 branch
22 inductor
23 branch
24 inductor
branch
26 tunable capacitor
27 capacitor
28 voltage limiter
29 branch
tunable resistor
31 resistor
32 switch
33 resistor
34 switch
35 resistor
36 switch
37 branch
38 branch
39 branch
40 feedback loop
50 amplifier
60 signal processor

The invention claimed is:

1. An impedance matching network (10) for an active RFID transceiver (1), the impedance matching network (10) comprising:
   an impedance transformer (14) comprising a transformer input (13) and a transformer output (15), wherein the transformer input (13) is connectable to an antenna (12),
   an RF modulator (16) connectable to the transformer output (15), and
   an RF demodulator (20) capacitively coupled to each of the transformer output (15) and the RF modulator (16) via a capacitor (18).

2. The impedance matching network (10) according to claim 1, wherein the impedance transformer (14) comprises a first branch (21) provided with a first inductor (22), the first branch (21) being connected to the transformer input (13) with a first end and being connected to the RF modulator (16) with a second end.

3. The impedance matching network (10) according to claim 1, further comprising a second branch (23) provided with a second inductor (24), the second branch (23) being connected to the RF modulator (16) with a first end and being connected to ground with a second end.

4. The impedance matching network (10) according to claim 2, further comprising a second branch (23) provided with a second inductor (24), the second branch (23) being connected to the RF modulator (16) with a first end and being connected to ground with a second end,
   wherein an inductance of the first inductor (22) is larger than an inductivity of the second inductor (24).

5. The impedance matching network (10) according to claim 2, further comprising a second branch (23) provided with a second inductor (24), the second branch (23) being connected to the RF modulator (16) with a first end and being connected to ground with a second end,
   wherein the first end of the second branch (24) is connected to the first inductor (22).

6. The impedance matching network (10) according to claim 1, further comprising a third branch (25) provided with a tunable capacitor (26), the third branch (25) being connected to the RF modulator (16) with a first end and being connected to ground with a second end.

7. The impedance matching network (10) according to claim 2, further comprising a third branch (25) provided with a tunable capacitor (26), the third branch (25) being connected to the RF modulator (16) with a first end and being connected to ground with a second end,
   wherein the first end of the third branch (25) is connected to the first inductor (22).

8. The impedance matching network (10) according to claim 2, wherein at least one of the RF modulator (16) and the RF demodulator (20) is implemented in an integrated circuit (8) and wherein the first inductor (22) is external to the integrated circuit (8).

9. The impedance matching network (10) according to claim 1, wherein the RF modulator (16) comprises a tunable resistor (30).

10. The impedance matching network (10) according to claim 9, wherein the tunable resistor (30) comprises a first resistor branch (37) and at least a second resistor branch (38) parallel to the first resistor branch (37), wherein at least one of the first resistor branch (37) and the second resistor branch (38) comprises a resistor (31, 33) in line with a switch (32, 34).

11. An impedance matching network (10) for an active RFID transceiver (1), the impedance matching network (10) comprising:
   an impedance transformer (14) comprising a transformer input (13) and a transformer output (15), wherein the transformer input (13) is connectable to an antenna (12),
   an RF modulator (16) connectable to the transformer output (15), and
   an RF demodulator (20) capacitively coupled to the transformer output (15) via a capacitor (18), wherein the RF demodulator (20) comprises a push pull amplifier (50) comprising a first and a second PMOS transistor (Pla, P1b) and a first and a second NMOS transistor (N1a, N1b) and wherein the gates of the first and second NMOS transistor are connected to the transformer output (15) via the capacitor (18).

12. The impedance matching network (10) according to claim 11, wherein the RF demodulator (20) comprises a common mode feedback loop (40) connected with a first end to a drain of the first PMOS transistor (P1a) and to a drain of the second PMOS transistor (P1*b*) and connected with a second end to a source of the first NMOS transistor (N1*a*) and to a source of the second NMOS transistor (N2*a*).

13. An active RFID transceiver (1) comprising:

an antenna (12), the impedance matching network (10) according to claim 1 and connected to the antenna (12), and a signal processor (60) connected to an output of the RF demodulator (20) of the impedance matching network (10).

\* \* \* \* \*